United States Patent
Lim et al.

(10) Patent No.: US 9,096,726 B2
(45) Date of Patent: Aug. 4, 2015

(54) COMPOSITION FOR FORMING SILICA BASED INSULATING LAYER, METHOD FOR MANUFACTURING COMPOSITION FOR FORMING SILICA BASED INSULATING LAYER, SILICA BASED INSULATING LAYER AND METHOD FOR MANUFACTURING SILICA BASED INSULATING LAYER

(75) Inventors: Sang-Hak Lim, Uiwang-si (KR); Bong-Hwan Kim, Uiwang-si (KR); Jung-Kang Oh, Uiwang-si (KR); Taek-Soo Kwak, Uiwang-si (KR); Jin-Hee Bae, Uiwang-si (KR); Hui-Chan Yun, Uiwang-si (KR); Dong-Il Han, Uiwang-si (KR); Sang-Kyun Kim, Uiwang-si (KR); Jin-Wook Lee, Uiwang-si (KR)

(73) Assignee: CHEIL INDUSTRIES, INC., Gumi-si, Kyeongsangbuk-do (KR)

( * ) Notice: Subject to any disclaimer, the term of this patent is extended or adjusted under 35 U.S.C. 154(b) by 236 days.

(21) Appl. No.: 13/339,728

(22) Filed: Dec. 29, 2011

(65) Prior Publication Data
US 2012/0177829 A1   Jul. 12, 2012

(30) Foreign Application Priority Data
Jan. 7, 2011   (KR) .................. 10-2011-0001802

(51) Int. Cl.
*B05D 3/02* (2006.01)
*C08G 77/54* (2006.01)
*H01L 21/02* (2006.01)
*H01L 49/02* (2006.01)

(52) U.S. Cl.
CPC .......... *C08G 77/54* (2013.01); *H01L 21/02164* (2013.01); *H01L 21/02216* (2013.01); *H01L 21/02222* (2013.01); *H01L 21/02282* (2013.01); *H01L 28/40* (2013.01)

(58) Field of Classification Search
CPC .............. C08G 77/54; H01L 21/02222; H01L 21/02216; H01L 28/40; H01L 21/02164; H01L 21/02282
USPC ............................... 427/385.5, 387
See application file for complete search history.

(56) References Cited

U.S. PATENT DOCUMENTS

| | | | |
|---|---|---|---|
| 6,011,167 A | 1/2000 | Tashiro et al. | |
| 6,562,465 B1 | 5/2003 | Nakashima et al. | |
| 2009/0140235 A1 | 6/2009 | Kamata et al. | |
| 2009/0305063 A1 | 12/2009 | Hayashi | |
| 2011/0129981 A1* | 6/2011 | Lim et al. ................ | 438/381 |

FOREIGN PATENT DOCUMENTS

| | | |
|---|---|---|
| JP | 07-294702 A | 11/1995 |
| JP | 08-325277 A | 12/1996 |
| JP | 10-046108 A | 2/1998 |
| JP | 11-302595 A | 11/1999 |
| JP | 2008-260939 A | 10/2008 |
| KR | 10-0600630 B1 | 2/2001 |
| KR | 10-2002-0075355 A | 10/2002 |
| KR | 10 2006-0066137 A | 6/2006 |
| KR | 10-0600631 B1 | 7/2006 |
| KR | 10 2007-0043849 A | 4/2007 |
| KR | 10-2009-0060433 A | 6/2009 |
| KR | 10-2011-0062158 A | 6/2011 |
| WO | WO 93/02472 A1 | 2/1993 |
| WO | WO 2008/029834 A1 | 3/2008 |

OTHER PUBLICATIONS

Gunji et al. "Preparation of Polysiloxazanes and Their Transformation to Silicon Oxynitride" Journal of the Ceramic Society of Japan 114 (6) 492-496 (2006).*

* cited by examiner

*Primary Examiner* — Robert S Walters, Jr.
(74) *Attorney, Agent, or Firm* — Lee & Morse, P.C.

(57) ABSTRACT

A composition for forming silica-based insulation layer includes a hydrogenated polysiloxazane including a moiety represented by the following Chemical Formula 1 and a moiety represented by the following Chemical Formula 2, and having a chlorine concentration of about 1 ppm or less:

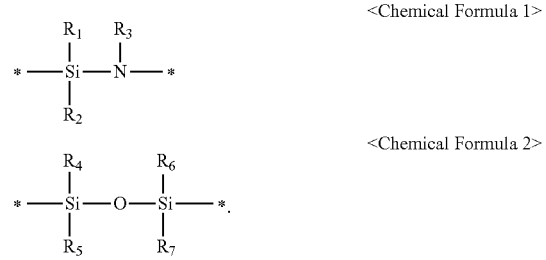

10 Claims, No Drawings

COMPOSITION FOR FORMING SILICA BASED INSULATING LAYER, METHOD FOR MANUFACTURING COMPOSITION FOR FORMING SILICA BASED INSULATING LAYER, SILICA BASED INSULATING LAYER AND METHOD FOR MANUFACTURING SILICA BASED INSULATING LAYER

BACKGROUND

1. Field

Embodiments relate to a composition for forming a silica-based insulation layer, a method of manufacturing the same, a silica-based insulation layer using the same, and a method of manufacturing the silica-based insulation layer.

2. Description of the Related Art

As semiconductor technology is increasingly developed, there is continuous research on forming highly-integrated and faster semiconductor memory cells that have improved performance and integrate smaller semi-conductor chips.

Among these semiconductor memory cells, e.g., DRAM (dynamic random access memory) may be used. The DRAM is capable of freely inputting and outputting information, and may realize large capacity.

The DRAM may include, e.g., a plurality of unit cells including one MOS transistor (MOS transistor) and one capacitor.

The capacitor may include two electrodes and a dielectric layer disposed therebetween. The capacitor may have various capacities depending on, e.g., a dielectric constant, a thickness of the dielectric layer, an area of the electrodes, and the like.

SUMMARY

An embodiment is directed to a composition for forming a silica-based insulation layer, the composition including a hydrogenated polysiloxazane including a moiety represented by the following Chemical Formula 1 and a moiety represented by the following Chemical Formula 2, the hydrogenated polysiloxazane having a chlorine concentration of about 1 ppm or less:

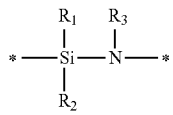
<Chemical Formula 1>

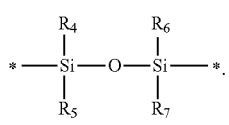
<Chemical Formula 2>

In Chemical Formula 1 and 2, $R_1$ to $R_7$ may each independently be hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a substituted or unsubstituted carbonyl group, a hydroxy group, or a combination thereof, provided that at least one of $R_1$ to $R_7$ is hydrogen.

The hydrogenated polysiloxazane may include a moiety represented by the following Chemical Formula 3 at a terminal end:

$$*\text{---SiH}_3. \qquad <\text{Chemical Formula 3}>$$

The hydrogenated polysiloxazane may have an oxygen content of about 0.2 to about 3 wt %, and the moiety represented by Chemical Formula 3 may be present in an amount of about 15 to about 35 wt % based on a total amount of a Si—H bond.

The hydrogenated polysiloxazane may have a weight average molecular weight of about 1,000 to about 5,000.

The hydrogenated polysiloxazane may be included in an amount of about 0.1 to about 50 wt %, based on a total weight of the composition.

Another embodiment is directed to a method of manufacturing a composition for forming silica-based insulation layer including hydrogenated polysiloxazane, the method including mixing a halosilane compound and with a solvent to perform coammonolysis to synthesize hydrogenated polysiloxazane and to prepare a hydrogenated polysiloxazane solution, exchanging a solvent of the hydrogenated polysiloxazane solution with a nonpolar solvent to prepare a solvent-exchanged hydrogenated polysiloxazane solution, aging the solvent-exchanged hydrogenated polysiloxazane solution at about −20 to about 5° C., and filtering the aged solvent-exchanged hydrogenated polysiloxazane solution to remove ammonium chloride.

After removing ammonium chloride by filtering, the hydrogenated polysiloxazane solution may have a chlorine concentration of about 1 ppm or less.

The nonpolar solvent may be xylene.

The aging may be performed for about 1 to about 48 hours.

Filtering the aged solvent-exchanged hydrogenated polysiloxazane solution to remove ammonium chloride may include filtering the aged solvent-exchanged hydrogenated polysiloxazane solution with a filter having a pore size of about 0.01 to about 20 μm.

Another embodiment is directed to a silica-based insulation layer fabricated from the composition for forming a silica-based insulation layer according to an embodiment. The silica-based insulation layer may have a defect number of about 1,000 or less/8 inch wafer wherein the defect has a size of 5 μm or less.

Another embodiment is directed to a method of manufacturing a silica-based insulation layer, the method including applying the composition for forming a silica-based insulation layer according to an embodiment on a substrate, drying the substrate on which the composition for forming silica-based insulation layer is applied, and curing the dried substrate with the composition thereon under an atmosphere including vapor at about 200° C. or more.

DETAILED DESCRIPTION

Korean Patent Application No. 10-2011-0001802, filed on Jan. 7, 2011, in the Korean Intellectual Property Office, and entitled: "Composition for Forming Silica Based Insulating Layer, Method for Manufacturing Composition for Forming Silica Based Insulating Layer, Silica Based Insulating Layer and Method for Manufacturing Silica Based Insulating Layer," is incorporated by reference herein in its entirety.

Example embodiments will now be described more fully hereinafter; however, they may be embodied in different forms and should not be construed as limited to the embodiments set forth herein. Rather, these embodiments are provided so that this disclosure will be thorough and complete, and will fully convey the scope of the invention to those skilled in the art.

As used herein, when a definition is not otherwise provided, the term "substituted" may refer to one substituted with at least one substituent selected from a halogen (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, an alkyl group, a C2 to C16 alkenyl group, a C2 to C16 alkynyl group, an aryl group, a C7 to C13 arylalkyl group, a C1 to C4 oxyalkyl group, a C1 to C20 heteroalkyl group, a C3 to C20 heteroarylalkyl group, a C3 to C15 cycloalkyl group, a C3 to C15 cycloalkenyl group, a C6 to C15 cycloalkynyl group, a C1 to C15 heterocycloalkyl group, and a combination thereof.

As used herein, when a definition is not otherwise provided, the prefix 'hetero' may refer to one including 1 to 3 heteroatoms selected from N, O, S, and P.

According to an embodiment, a silica-based insulation layer fabricated using a composition for forming silica-based insulation layer, as described herein, may exhibit decreased defects and improved insulating and gap-fill properties desired for a silica-based insulation layer.

According to an embodiment, the composition for forming a silica-based insulation layer may include a hydrogenated polysiloxazane, the hydrogenated polysiloxazane including a moiety represented by the following Chemical Formula 1 and a moiety represented by the following Chemical Formula 2.

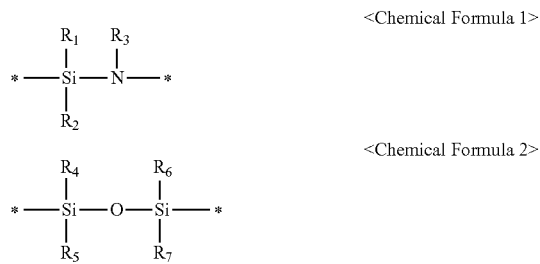

In Chemical Formulae 1 and 2, $R_1$ to $R_7$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a substituted or unsubstituted carbonyl group, a hydroxy group, or a combination thereof, provided that at least one of $R_1$ to $R_7$ is hydrogen.

The composition for forming a silica-based insulation layer may have a chlorine concentration of about 1 ppm or less. Preferably, the chlorine concentration may range from about 0.1 to about 0.5 ppm.

The hydrogenated polysiloxazane includes a silicon-oxygen-silicon (Si—O—Si) bond other than a silicon-nitrogen (Si—N) bond in the structure. This silicon-oxygen-silicon (Si—O—Si) bond may relieve stress during the curing by heat treatment and thus, decrease contraction.

Particulates resulting from ammonium chloride (produced when a hydrogenated polysiloxazane is synthesized) may cause a silica-based insulation layer (used in a process for forming devices such as semiconductor and liquid crystal) to have defects. Removing the ammonium chloride may reduce the defects that occur when the silica-based insulation layer is formed, and the concentration of chlorine may be reduced by removing the ammonium chloride. A method for reducing the amount of ammonium chloride during the synthesis of hydrogenated polysiloxazane is described below.

In an embodiment, the hydrogenated polysiloxazane may have an oxygen content of about 0.2 to about 3 wt %. When it includes an oxygen content within the range, a silicon-oxygen-silicon (Si—O—Si) bond in the structure may sufficiently relieve stress and prevent contraction during the heat treatment and, thus, avoid a crack on a charge pattern.

The hydrogenated polysiloxazane preferably has an oxygen content of about 0.4 to about 2 wt %.

In another embodiment, the hydrogenated polysiloxazane may include a moiety represented by the following Chemical Formula 3 at its terminal end.

 [Chemical Formula 3]

The moiety represented by the above Chemical Formula 3 is capped with hydrogen and may be included in an amount of about 15 to 35 wt %, based on the total amount of the Si—H bond in the hydrogenated polysiloxazane. When it is included within the range, it may bring about sufficient oxidation reaction during the heat treatment and prevent scattering of $SiH_3$ into $SiH_4$. Accordingly, the Si—H bond may prevent contraction and, thus, a crack on a charge pattern.

In another embodiment, the hydrogenated polysiloxazane may have a weight average molecular weight (Mw) of about 1,000 to about 5,000. When the weight average molecular weight (Mw) is within the range, components evaporating during the heat treatment of the composition for forming silica-based insulation layer may be lessened and fine gaps of less than 50 nm may be filled densely. The hydrogenated polysiloxazane preferably has a weight average molecular weight (Mw) of about 1,500 to about 3,500.

In another embodiment, the hydrogenated polysiloxazane may be included in an amount of about 0.1 to about 50 wt %, based on the total amount of the composition for forming silica-based insulation layer. Within the range, an appropriate level of viscosity may be maintained and the composition for forming silica-based insulation layer including the hydrogenated polysiloxazane may fill a gap evenly and uniformly with no void.

The composition for forming silica-based insulation layer may further include a thermal acid generator (TAG). The thermal acid generator may be an additive to improve developing property of the hydrogenated polysiloxazane. The hydrogenated polysiloxazane may be developed at a relatively low temperature.

The thermal acid generator may include any suitable compound that generates acid ($H^+$) by heat. For example, it may include a compound activated at about 90° C. or higher and generating sufficient acid and also, having low volatility. Such a thermal acid generator may be, for example, selected from nitrobenzyl tosylate, nitrobenzyl benzenesulfonate, phenol sulfonate, and a combination thereof.

The thermal acid generator may be included in an amount of about 0.01 to about 25 wt % based on the total amount of the composition for forming silica-based insulation layer. Within the range, the hydrogenated polysiloxazane may be developed at a low temperature and, simultaneously, have improved coating properties.

The composition for forming a silica-based insulation layer may further include a surfactant.

The surfactant may include, for example, a non-ion-based surfactant of polyoxyethylene alkyl ethers such as polyoxyethylene lauryl ether, polyoxyethylene stearyl ether, polyoxyethylene cetyl ether, polyoxyethylene oleyl ether, and the like; polyoxyethylene alkylallyl ethers such as polyoxyethylene nonylphenolether, and the like; polyoxyethylene.polyoxypropylene block copolymers; polyoxyethylene sorbitan fatty acid ester such as sorbitan monolaurate, sorbitan monopalmitate, sorbitan monostearate, sorbitan monooleate, polyoxyethylene sorbitan monostearate, polyoxyethylene sorbitan trioleate, polyoxyethylene sorbitan tristearate, and the like; a fluorine-based surfactant of EFTOP EF301, EF303, EF352 (Tochem Products Co., Ltd.), MEGAFACE F171, F173 (Dainippon Ink & Chem., Inc.), FLUORAD FC430, FC431 (Sumitomo 3M), Asahi guardAG710, Surflon S-382, SC101, SC102, SC103, SC104, SC105, SC106 (Asahi Glass Co., Ltd.), and the like; another silicone-based surfactant such as a organosiloxane polymer KP341 (Shin-Etsu Chemical Co., Ltd.), and the like.

The surfactant may be included in an amount of about 0.001 to about 10 wt %, based on the total amount of the composition for forming silica-based insulation layer. Within the range, it may improve dispersion of a solution and simultaneously, increase uniform thickness of a layer and filling properties.

The composition for forming silica-based insulation layer may be a solution where the hydrogenated polysiloxazane and the other components are dissolved in a solvent.

The solvent may be any suitable solvent that dissolves the components. Examples of the solvent include alcohols such as methanol, ethanol, and the like; dichloroethyl ether, n-butyl ether, diisoamyl ether, methylphenyl ether, tetrahydrofuran, and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactic acid esters such as methyl lactate, ethyl lactate, and the like; alkyl oxoacetates such as methyl oxoacetate, ethyl oxoacetate, butyl oxoacetate, and the like; alkoxy alkyl acetates such as methoxy methyl acetate, methoxy ethyl acetate, methoxy butyl acetate, ethoxy methyl acetate, ethoxyethyl acetate, and the like; alkyl 3-oxopropionates such as methyl 3-oxopropionate, ethyl 3-oxopropionate, and the like; alkyl 3-alkoxy propionates such as methyl 3-methoxy propionate, ethyl 3-methoxy propionate, ethyl 3-ethoxy propionate, methyl 3-ethoxy propionate, and the like; alkyl 2-oxopropionates such as methyl 2-oxopropionate, ethyl 2-oxopropionate, propyl 2-oxopropionate, and the like; alkyl 2-alkoxy propionates such as methyl 2-methoxypropionate, ethyl 2-methoxypropionate, ethyl 2-ethoxypropionate, methyl 2-ethoxypropionate, and the like; monooxy monocarboxylic acid alkyl esters of 2-alkoxy-2-alkyl propionates such as 2-methoxy-2-methyl methyl propionate, 2-ethoxy-2-methyl ethyl propionate, and the like; esters such as ethyl 2-hydroxy propionate, ethyl 2-hydroxy-2-methyl propionate, ethyl hydroxy acetate, methyl 2-hydroxy-3-methyl butyrate, and the like; ketone acid esters such as ethyl pyruvate, and the like. In addition, it may include a solvent with a high boiling point such as N-methylformamide, N,N-dimethyl formamide, N-methylformanylide, N-methylacetamide, N,N-dimethyl acetamide, N-methylpyrrolidone, dimethylsulfoxide, benzylethylether, dihexylether, acetylacetone, isophorone, caproic acid, caprylic acid, 1-octanol, 1-nonanol, benzyl alcohol, benzyl acetate, ethyl benzoate, diethyl oxalate, diethyl malate, γ-butyrolactone, carbonate ethylene, carbonate propylene, phenyl cellosolve acetate, and the like. Of these solvents, diethyleneglycol monomethylether, diethyleneglycol diethylether, ethyl-3-ethoxy propinonate, methyl-3-methoxy propinonate, cyclopentanone, cyclohexanone, propyleneglycol monomethylether acetate, propyleneglycol dimethylether acetate, 1-methoxy-2-propanol, ethyl lactate, cyclopentanone, and ethyl hydroxy acetate may be selected.

In an implementation, at least one of the solvents may have a high boiling point. The solvent with a high boiling point may prevent generation of a void in a gap when the gap is filled. It also may increase layer flatness, since it may be slowly volatilized.

The solvent may be included as a balance except for the aforementioned components based on the total amount of the composition for forming silica-based insulation layer.

Another embodiment provides a method manufacturing of composition for forming a silica-based insulation layer including a hydrogenated polysiloxazane that includes mixing a halosilane compound and with a solvent to perform coammonolysis to synthesize hydrogenated polysiloxazane and to prepare a hydrogenated polysiloxazane solution; exchanging a solvent of the hydrogenated polysiloxazane solution with a nonpolar solvent; aging the hydrogenated polysiloxazane solution that undergoes solvent exchange to the nonpolar solvent at about −20 to about 5° C.; and filtering the aged hydrogenated polysiloxazane solution to remove ammonium chloride.

In another embodiment, after removing ammonium chloride by filtering, the hydrogenated polysiloxazane solution may have a chlorine concentration of about 1 ppm or less. Preferably, a hydrogenated polysiloxazane solution having a chlorine concentration of about 0.1 to about 0.5 ppm may be prepared.

In another embodiment, the nonpolar solvent may be xylene.

In another embodiment, the hydrogenated polysiloxazane solution that undergoes solvent exchange to the nonpolar solvent may be aged at a low temperature, preferably for about 1 to about 48 hours.

Ammonium chloride crystal particles are grown by preparing the hydrogenated polysiloxazane solution and aging it in a nonpolar solvent at a low temperature. The ammonium chloride crystal particles may be filtered with a filter. Thus, the concentration of chlorine may be reduced by removing ammonium chloride. As the concentration of chlorine becomes lower, the silica-based insulation layer may exhibit fewer defects.

In accordance with another embodiment, the pore size of the filter may be controlled to remove the ammonium chloride particulates of a predetermined size or more. For example, when a filter having a pore size of 0.01 to 20 μm is used, ammonium chloride particulates that are greater than the pore size of the filter may be filtered and removed.

A silica-based insulation layer according to another embodiment may be fabricated using the composition for forming silica-based insulation layer, including the hydrogenated polysiloxazane, and may exhibit a defect number of about 1,000 or less/8 inch wafer wherein the defect has a size of 5 μm or less.

The method for forming the silica-based insulation layer may be formed using a general method, e.g., coating a device substrate such as semiconductor substrate or liquid crystal substrate with the aforementioned composition for forming silica-based insulation layer, drying the substrate, and curing it in an atmosphere including vapor (i.e., water vapor) at about 200° C. or higher.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

EXAMPLES

Example 1

The inside of a reactor equipped with an agitator and a temperature controller having a capacity of 2 L was purged with drying nitrogen. Subsequently, 0.3 g of deionized water was added into 1,500 g of drying pyridine and mixed sufficiently, and then the mixture was put into the reactor and maintained at 5° C. Subsequently, 100 g of dichlorosilane was slowly added over one hour. Also, 70 g of ammonia was slowly added over 3 hours while agitating the mixture. Subsequently, drying nitrogen was supplied for 30 minutes, and the ammonia remaining in the inside of the reactor was removed so as to obtain a white slurry product. The white slurry product was filtered using a filter formed of 1 μm TEFLON (polytetrafluoroethylene) material in the atmosphere of drying nitrogen so as to obtain 1,000 g of filtrate. After adding 1,000 g of drying xylene, a process of substituting the solvent from pyridine to xylene was performed three times by using a rotary evaporator so as to control the solid concentration to 20 wt %, and then filtration was performed using a filter formed of a TEFLON material and having a pore size of 0.03 μm so as to obtain hydrogenated polysiloxazane. The oxygen content of the obtained hydrogenated polysiloxazane was 0.5 wt %, and the $SiH_3$/SiH (total) weight ratio was 0.20, and the weight average molecular weight was 2,000, and the chlorine content was 3.0 ppm. (This was referred to as a hydrogenated polysiloxazane solution A)

The solution was poured into a 5 L stainless steel canister and the inside of the stainless steel canister was sufficiently purged with drying nitrogen and a pressure of 1 $kg/cm^2G$ was applied to the canister. The solution was aged in a freezer set to −10° C. for 10 hours, and then filtered with a filter formed of a TEFLON material and having a pore size of 0.03 μm. The oxygen content of hydrogenated polysiloxazane, the $SiH_3$/SiH (total) weight ratio, and the weight average molecular weight were the same as those before the aging, but the chlorine content was decreased to 0.5 ppm.

The solution was applied to an 8-inch N-type bare silicon wafer using a spin coater and dried on a hot plate set to 100° C. The coated wafer was cured in the oxygen atmosphere including vapor (water vapor) of a partial pressure of 5 kPa at a temperature 500° C. for one hour. A defect test result of the acquired layer is shown in Table 1.

Example 2

Hydrogenated polysiloxazane solution A described in Example 1 was poured into a 5 L stainless steel canister and the inside of the canister was sufficiently purged with drying nitrogen and a pressure of 1 $kg/cm^2G$ was applied to the canister. The solution was aged in a freezer set to −10° C. for 30 hours, and then filtered with a filter formed of a TEFLON material and having a pore size of 0.02 μm. The oxygen content of hydrogenated polysiloxazane, the $SiH_3$/SiH (total) weight ratio, and the weight average molecular weight were the same as those before the aging, but the chlorine content was decreased to 0.2 ppm.

The solution was applied to an 8-inch N-type bare silicon wafer with a spin coater and dried on a hot plate set to 100° C. The coated wafer was cured in the oxygen atmosphere including vapor partial pressure of 5 kPa at a temperature 500° C. for one hour. A defect test result of the acquired layer is shown in Table 1.

Comparative Example 1

Hydrogenated polysiloxazane solution A described in Example 1 was applied to an 8-inch N-type bare silicon wafer with a spin coater and dried on a hot plate set to 100° C. The coated wafer was cured in the oxygen atmosphere including vapor partial pressure of 5 kPa at a temperature 500° C. for one hour. A defect test result of the acquired layer is shown in Table 1.

Comparative Example 2

Hydrogenated polysiloxazane solution A described in Example 1 was concentrated by using an additional rotary evaporator until its solid concentration reaches 30 wt %, and then drying pyridine was added to the concentrated solution until the solid concentration reaches 20 wt %.

The solution was poured into a 5 L stainless steel canister and the inside of the stainless steel canister was sufficiently purged with drying nitrogen and a pressure of 1 $kg/cm^2G$ was applied to the canister. The solution was aged in a freezer set to −10° C. for 30 hours, and then filtered with a filter formed of a TEFLON material and having a pore size of 0.03 μm. The oxygen content of hydrogenated polysiloxazane, the $SiH_3$/SiH (total) weight ratio, and the weight average molecular weight were the same as those before the aging. The chlorine content was decreased to 2.5 ppm.

The solution was applied to a 8-inch N-type bare silicon wafer with a spin coater and dried on a hot plate set to 100° C. The coated wafer was cured in the oxygen atmosphere including vapor partial pressure of 5 kPa at a temperature 500° C. for one hour. A defect test result of the acquired layer is shown in Table 1.

Comparative Example 3

Hydrogenated polysiloxazane solution A described in Example 1 was poured into a 5 L stainless steel canister and the inside of the canister was sufficiently purged with drying nitrogen and a pressure of 1 $kg/cm^2G$ was applied to the canister. The solution was aged at room temperature for 30 hours, and then filtered with a filter formed of a TEFLON material and having a pore size of 0.02 μm. The oxygen content of hydrogenated polysiloxazane, the $SiH_3$/SiH (total)

weight ratio, and the weight average molecular weight were the same as those before the aging. The chlorine content was decreased to 2.0 ppm.

The solution was applied to a 8-inch N-type bare silicon wafer with a spin coater and dried on a hot plate set to 100° C. The coated wafer was cured in the oxygen atmosphere including vapor partial pressure of 5 kPa at a temperature 500° C. for one hour. A defect test result of the acquired layer is shown in Table 1.

Comparative Example 4

Water was added to the hydrogenated polysiloxazane solution A described in Example 1 and then agitated for 3 hours and allowed to stand to separate and remove a supernatant and obtain hydrogenated polysiloxazane which was precipitated as solid in the lower layer. The obtained hydrogenated polysiloxazane was dissolved in a xylene solvent at a solid weight ratio of 20%. The solution was applied to an 8-inch N-type bare silicon wafer with a spin coater and dried on a hot plate set to 100° C. The coated wafer was cured in the oxygen atmosphere including vapor partial pressure of 5 kPa at a temperature 500° C. for one hour. A defect test result of the acquired layer is shown in Table 1.

Analysis and evaluation devices were as follows.
Oxygen content: FlashEA 1112: manufactured by Thermo Fisher Scientific Inc.
SiH$_3$/SiH (total): AC-200: 200 MHz proton NMR manufactured by Bruker: the ratio of the amount of SiH$_3$ group to the total amount of SiH group was calculated.
Weight average molecular weight: GPC manufactured by Waters; HPLC Pump 1515, RI Detector 2414; Column manufactured by Shodex; KF801, 802, 803.
Content of chlorine: Chlorine analyzer manufactured by Mitsubishi Chemical Analytech; TOX-2100H.
Evaluation of the number of defects: Surfscan SP1 manufactured by KLA-Tencor

TABLE 1

| | Defect number/8-inch wafer | | |
|---|---|---|---|
| Defect size (nm) | 0.150-0.403 μm | 0.403-1.085 μm | 1.085-2.917 μm |
| Bare wafer | 4 | 0 | 0 |
| Example 1 | 89 | 23 | 1 |
| Example 2 | 28 | 5 | 0 |
| Comparative Example 1 | 3803 | 530 | 40 |
| Comparative Example 2 | 4804 | 260 | 3 |
| Comparative Example 3 | 1670 | 126 | 15 |
| Comparative Example 4 | 8450 | 783 | 32 |

It may be seen from the results of Table 1 that the insulating layers of Examples 1 and 2 with decreased chlorine content had a remarkably decreased number of defects.

By way of summation and review, reductions of a size of a semiconductor chip may result in reductions in the size of a capacitor therein. However, the smaller capacitor should have sufficient storage capacity. The capacitor may accomplish greater capacity by, e.g., increasing the vertical area instead of decreasing the horizontal area to increase overall active area. When a capacitor is formed in this way, a composition for forming silica-based insulation layer may be used to fill a mold and a gap thereon and effectively form an electrode being relatively high compared with small horizontal area.

As described above, an embodiment provides a composition for forming silica-based insulation layer including hydrogenated polysiloxazane having a low remaining chlorine content. Another embodiment provides a method of manufacturing a composition for forming silica-based insulation layer including hydrogenated polysiloxazane having a low remaining chlorine content. Yet another embodiment provides a silica-based insulation layer having a small number of defects. Still another embodiment provides a method of manufacturing a silica-based insulation layer having a small number of defects.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A composition for forming a silica-based insulation layer, the composition comprising:
an aged and filtered hydrogenated polysiloxazane including a moiety represented by the following Chemical Formula 1 and a moiety represented by the following Chemical Formula 2, the hydrogenated polysiloxazane having a chlorine concentration of about 0.1 ppm to about 1 ppm:

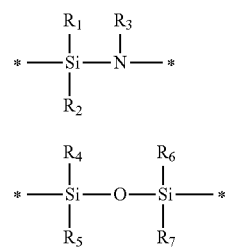

wherein R$_1$ to R$_7$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a substituted or unsubstituted carbonyl group, a hydroxy group, or a combination thereof, provided that at least one of R$_1$ to R$_7$ is hydrogen.

2. The composition as claimed in claim 1, wherein:
the hydrogenated polysiloxazane includes a moiety represented by the following Chemical Formula 3 at a terminal end:

  <Chemical Formula 3> the hydrogenated polysiloxazane has an oxygen content of about 0.2 to about 3 wt %, and the moiety represented by Chemical Formula 3 is present in an amount of about 15 to about 35 wt % based on a total amount of a Si—H bond.

3. The composition as claimed in claim 1, wherein the hydrogenated polysiloxazane has a weight average molecular weight of about 1,000 to about 5,000.

4. The composition as claimed in claim 1, wherein the hydrogenated polysiloxazane is included in an amount of about 0.1 to about 50 wt %, based on a total weight of the composition.

5. A method of manufacturing a composition for forming silica-based insulation layer including hydrogenated polysiloxazane, the method comprising:
   mixing a halosilane compound with a solvent to perform coammonolysis to synthesize hydrogenated polysiloxazane and to prepare a hydrogenated polysiloxazane solution;
   exchanging a solvent of the hydrogenated polysiloxazane solution with a nonpolar solvent to prepare a solvent-exchanged hydrogenated polysiloxazane solution;
   aging the solvent-exchanged hydrogenated polysiloxazane solution at about −20 to about 5° C.; and
   filtering the aged solvent-exchanged hydrogenated polysiloxazane solution to remove ammonium chloride,
   wherein, after removing ammonium chloride by filtering, the hydrogenated polysiloxazane solution has a chlorine concentration of about 1 ppm or less.

6. The method as claimed in claim 5, wherein the nonpolar solvent is xylene.

7. The method as claimed in claim 5, wherein the aging is performed for about 1 to about 48 hours.

8. The method as claimed in claim 5, wherein filtering the aged solvent-exchanged hydrogenated polysiloxazane solution to remove ammonium chloride includes filtering the aged solvent-exchanged hydrogenated polysiloxazane solution with a filter having a pore size of about 0.01 to about 20 μm.

9. A silica-based insulation layer fabricated from the composition for forming a silica-based insulation layer as claimed in claim 1, the silica-based insulation layer having a defect number of about 1,000 or less/8 inch wafer wherein the defect has a size of 5 μm or less.

10. A method of manufacturing a silica-based insulation layer, the method comprising:
    applying the composition for forming a silica-based insulation layer as claimed in claim 1 on a substrate;
    drying the substrate on which the composition for forming silica-based insulation layer is applied; and
    curing the dried substrate with the composition thereon under an atmosphere including vapor at about 200° C. or more.

* * * * *